United States Patent
Degrenne et al.

(10) Patent No.: US 12,013,428 B2
(45) Date of Patent: Jun. 18, 2024

(54) METHOD AND DEVICE FOR MONITORING GATE SIGNAL OF POWER SEMICONDUCTOR

(71) Applicant: MITSUBISHI ELECTRIC CORPORATION, Tokyo (JP)

(72) Inventors: Nicolas Degrenne, Rennes (FR); Julio Cezar Brandelero, Rennes (FR); Stefan Mollov, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 327 days.

(21) Appl. No.: 17/422,383

(22) PCT Filed: Jan. 16, 2020

(86) PCT No.: PCT/JP2020/002199
§ 371 (c)(1),
(2) Date: Jul. 12, 2021

(87) PCT Pub. No.: WO2020/179263
PCT Pub. Date: Sep. 10, 2020

(65) Prior Publication Data
US 2022/0091177 A1  Mar. 24, 2022

(30) Foreign Application Priority Data
Mar. 1, 2019 (EP) .................... 19160277

(51) Int. Cl.
*G01R 31/26* (2020.01)
*G01R 31/28* (2006.01)
(Continued)

(52) U.S. Cl.
CPC ..... *G01R 31/2642* (2013.01); *G01R 31/2836* (2013.01); *G01R 31/40* (2013.01); *H03K 17/567* (2013.01)

(58) Field of Classification Search
CPC ............... G01R 31/40; G01R 31/2836; G01R 31/2608; G01R 31/2642; H03K 17/18; H03K 17/567
See application file for complete search history.

(56) References Cited

U.S. PATENT DOCUMENTS

2011/0193580 A1* 8/2011 League .................. G01R 31/40
324/762.09
2014/0085762 A1* 3/2014 Shimano ............. H02M 7/5387
361/91.6
(Continued)

FOREIGN PATENT DOCUMENTS

CN 104237761 A 12/2014
CN 108872761 A 11/2018
(Continued)

OTHER PUBLICATIONS

Japanese Office Action for Japanese Application No. 2021-552088, dated Apr. 19, 2022.
(Continued)

*Primary Examiner* — Thang X Le
(74) *Attorney, Agent, or Firm* — Birch, Stewart, Kolasch & Birch, LLP

(57) ABSTRACT

The present invention concerns a method and device for monitoring the gate signal of a power semiconductor (SI), the gate signal of the power semiconductor (SI) being provided by a gate driver (12), generates an expected signal (VGexp) that corresponds to the signal outputted by the gate driver (12) when no deterioration of the gate driver (12) and/or of the power semiconductor (SI) and/or of a load linked to the power semiconductor (SI) exists, compares the expected signal (VGexp) and the signal (VGmeas) outputted by the gate driver (12), determines if a deterioration of the gate driver (12) and/or of the power semiconductor (SI) and/or of a load linked to the power semiconductor (SI)

(Continued)

exists using the result of the comparing of the expected signal (VGexp) and the signal (VGmeas) outputted by the gate driver (12).

14 Claims, 6 Drawing Sheets

(51) Int. Cl.
*G01R 31/40* (2020.01)
*H03K 17/567* (2006.01)

(56) References Cited

U.S. PATENT DOCUMENTS

| | | | | |
|---|---|---|---|---|
| 2014/0368232 A1* | 12/2014 | Wu | ............... | H03K 17/18 |
| | | | | 324/762.08 |
| 2016/0018446 A1* | 1/2016 | Chen | ............... | H03K 17/00 |
| | | | | 363/56.05 |
| 2016/0282407 A1* | 9/2016 | Bacigalupo | ........ | G01R 31/2621 |
| 2017/0366125 A1* | 12/2017 | Joyce | ............... | H02P 9/305 |
| 2018/0331678 A1 | 11/2018 | Kaneda | | |
| 2020/0014295 A1* | 1/2020 | Ikeda | ............... | H02M 1/4225 |

FOREIGN PATENT DOCUMENTS

| | | |
|---|---|---|
| EP | 3 261 215 A1 | 12/2017 |
| JP | 60-131479 A | 7/1985 |
| JP | 61-262671 A | 11/1986 |
| JP | 2003-143833 A | 5/2003 |
| KR | 10-2010-0012553 A | 2/2010 |

OTHER PUBLICATIONS

Chinese Office Action and Search Report for Chinese Application No. 202080015436.1, dated Apr. 4, 2024, with English translation.

* cited by examiner

METHOD AND DEVICE FOR MONITORING GATE SIGNAL OF POWER SEMICONDUCTOR

TECHNICAL FIELD

The present invention relates generally to a method and a system for device for monitoring the gate signal of a power semiconductor.

BACKGROUND ART

In field applications such as traction, most of the failures on gate drivers of power semiconductors are reported as desaturation errors, i.e. the gate driver reports an abnormal condition wherein the gate voltage is at a high level and the voltage across the semiconductor is higher than a threshold value. The reporting of such anomaly is often a false positive, i.e. a problem is notified despite the gate driver and the power semiconductor operate normally. In some other cases, such reporting can be a true positive, i.e. when a short-circuit occurs.

Short-circuits are typically caused by the gate driver itself, the controller, the power semiconductor, or the load. The usually implemented protection methods avoid a catastrophic failure but do not help the maintenance team to understand the source of the failure. In some cases where the gate driver is faulty, the whole system may be changed while only a low-cost replacement of the gate driver board would have solved the issue.

It is thus important to monitor efficiently the operation of the gate driver itself, the operation of the power semiconductor, and to improve diagnostics.

SUMMARY OF INVENTION

The present invention aims to allow an efficient monitoring of a gate driver and of a power semiconductor.

To that end, the present invention concerns a device for monitoring the gate signal of a power semiconductor, the gate signal of the power semiconductor being provided by a gate driver, characterized in that the device comprises:
  means for generating an expected signal that corresponds to the signal outputted by the gate driver when no deterioration of the gate driver and/or of the power semiconductor and/or of a load linked to the power semiconductor exists,
  means for comparing the expected signal and the signal outputted by the gate driver,
  means for determining if a deterioration of the gate driver and/or of the power semiconductor and/or of a load linked to the power semiconductor exists using the result of the comparing of the expected signal and the signal outputted by the gate driver.

The present invention concerns also a method for monitoring the gate signal of a power semiconductor, the gate signal of the power semiconductor being provided by a gate driver, characterized in that the method comprises the steps of:
  generating an expected signal that corresponds to the signal outputted by the gate driver when no deterioration of the gate driver and/or of the power semiconductor and/or of a load linked to the power semiconductor exists,
  comparing the expected signal and the signal outputted by the gate driver,
  determining if a deterioration of the gate driver and/or of the power semiconductor and/or of a load linked to the power semiconductor exists using the result of the comparing of the expected signal and the signal outputted by the gate driver.

Thus, the anomalies in the gate signal trajectory are extracted at high speed during the commutation. The diagnostic is then improved.

According to a particular feature, the means for generating the expected signal comprise at least a capacitor and a resistor. Thus, the implementation is performed with off-the-shelf and low-cost electronic components.

According to a particular feature, the gate driver comprises a first isolation module and the output of the means for determining if a deterioration occurs is connected to a second isolation module. Thus, the requirements on the second isolation e.g. time response, bandwidth are low.

According to a particular feature, the gate driver and means for generating an expected signal receive a pulse width modulated signal and a signal taken on a connection of the semiconductor that is different from the gate signal. Thus, gate drivers using a signal from the power semiconductor for protection or gate trajectory control can be diagnosed.

According to a particular feature, the means for determining if the deterioration occurs process the result of the comparing of the expected signal and the signal outputted by the gate driver by comparing the result of the comparing to a threshold and/or by performing integration and/or mean and/or extreme values of the result of the comparing and comparing these integration and/or mean and/or extreme values to thresholds in order to detect a deterioration and/or by comparing the result of the comparing to stored envelopes of signals. Thus, the means for determining if the deterioration occurs can be implemented with high bandwidth analog circuits.

According to a particular feature, the value of the at least one threshold is predetermined. Thus, the method is operational from the first operation of the power semiconductor and the designer can select the sensitivity to certain failures.

According to a particular feature, the value of the at least one threshold is equal to X % the maximum value observed during the first 100 cycles of operation of the device, X being predefined and superior to 100%. Thus, the method does not require prior definition by the designer and adapts to the specificities of the system it is integrated in (e.g. power semi-conductor variabilities, operating conditions).

According to a particular feature, the value of the threshold is equal to X % of the maximum value observed from the beginning of operation of the device, X being predefined and superior to 100%. Thus, the method detects sudden deterioration and does not detect progressive deterioration.

BRIEF DESCRIPTION OF DRAWINGS

The characteristics of the invention will emerge more clearly from a reading of the following description of example embodiments, the said description being produced with reference to the accompanying drawings, among which.

DESCRIPTION OF EMBODIMENTS

Figure 1A:
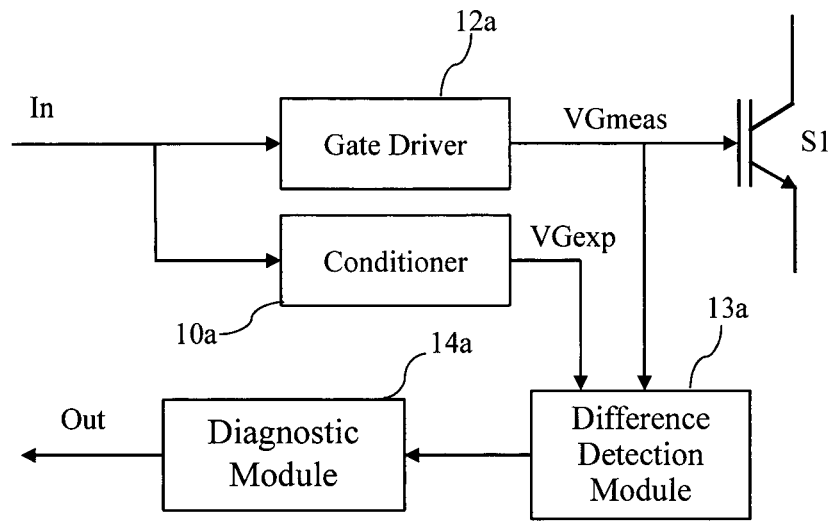
FIG. 1A represents a first example of an architecture of a gate driver of a power semiconductor in which the present invention is implemented.

FIG. 1A represents a first example of an architecture of a gate driver of a power semiconductor in which the present invention is implemented.

According to the first example of realization, a conditioner 10a generates an expected gate signal VGexp from the input signal In provided to the gate driver 12a that provides a gate signal VGmeas to the power semiconductor S1. The gate signal VGmeas is compared to the expected gate driver signal VGexp by a difference detection module 13a in order to determine deviations of VGmeas and VGexp. The comparison may be a subtraction of one signal to the other signal and an amplification of the subtraction result. The output of the difference detection module 13a is provided to a diagnostic module 14a that quantifies the output of the difference detection module 13a using, for example, comparison with different kinds of signal envelopes, mathematical operations, e.g. max, mean and integral.

The generation by the conditioner 10a of the expected gate signal VGexp can be tuned to reflect specificities relative to the power semi-conductor and/or operating conditions. The generation of VGexp is performed based on the input signal, using a model the transfer function of which reproduces the transfer function of the gate driver 12a in normal operation.

The input signal In is for example a PWM signal generated by an external controller not shown in FIG. 1A.

The transfer function used by the conditioner 10a is a circuit composed by a buffer, buf, which introduces a fixed delay, t1, and a RC circuit, VGexp is the voltage between the R and the C components. The R and/or the C values can be tuned depending of the power semiconductor S1. The fixed delay, t1, has the same value than the delay produced by the gate driver 12a. The time constant of the circuit RC is equal to the time constant of the typical gate resistor (internal plus external) and the equivalent input capacitance of the power semiconductor S1. For example, the value of the resistor is around 10Ω and the capacitance C is around 10 nF. The conditioner 10a may implement non-linear controlled capacitor and/or resistor values.

In a particular feature, the voltage supply of the conditioner 10a is inferior to the voltage supply of the gate driver 12a by a divisor factor K. In this case, the voltage between R and C is amplified by a factor K. Thus, the power necessary to supply the conditioner 10a is reduced by a factor $K^2$.

The expected signal VGexp is a signal that corresponds to the signal outputted by the gate driver when no deterioration of the gate driver and/or of the power semiconductor and/or of a load linked to the power semiconductor exist.

Figure 1B:
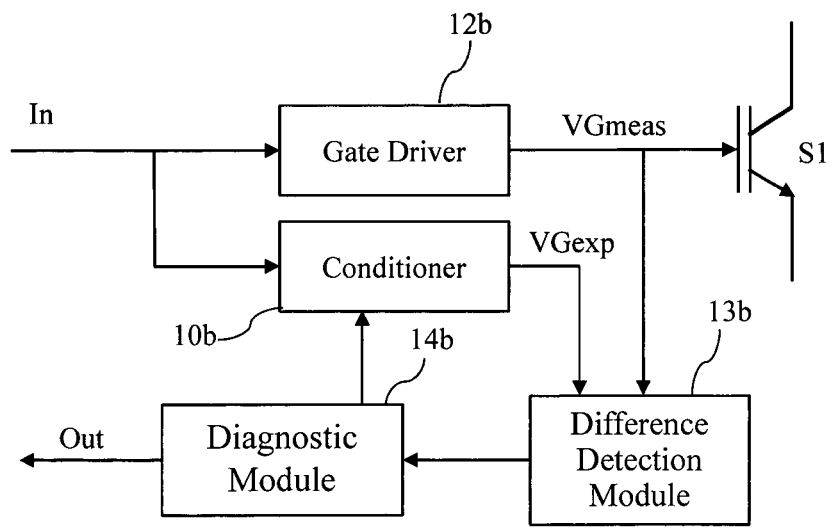
FIG. 1B represents a second example of an architecture of a gate driver of a power semiconductor in which the present invention is implemented.

FIG. 1B represents a second example of an architecture of a gate driver of a power semiconductor in which the present invention is implemented.

According to the second example of realization, a conditioner 10b generates an expected gate signal VGexp from the input signal In provided to the gate driver 12b that provides a gate signal VGmeas to the power semiconductor S1. The gate signal VGmeas is compared to the expected gate driver signal VGexp by a difference detection module 13b in order to determine deviations of VGmeas and VGexp. The comparison may be a subtraction of one signal to the other signal and an amplification of the subtraction result. The output of the difference detection module 13b is provided to a diagnostic module 14b that quantifies the output of the difference detection module 13b using, for example, comparison with different kinds of signal envelopes, mathematical operations, e.g. max, mean and integral.

The generation by the conditioner 10b of the expected gate signal VGexp is controlled by the diagnostic module 14b in order to implement controlled capacitor and/or resistors values provided by the diagnostic module so as to represent more accurately the expected gate signal VGexp. The diagnostic module 14b may select one transfer function out of several. The conditioner 10b may generate the signal VGexp using a processing unit and a digital to analog converter based on a lookup table, a model or a transfer function provided by the diagnostic module 14b.

The expected signal VGexp is a signal that corresponds to the signal outputted by the gate driver with no deterioration of the gate driver and/or of the power semiconductor and/or of a load linked to the power semiconductor exist.

Figure 1C:
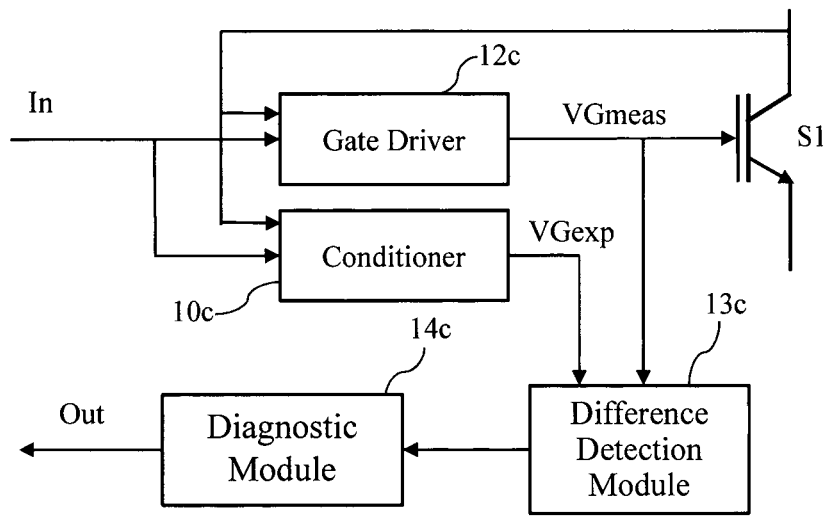
FIG. 1C represents a third example of an architecture of a gate driver of a power semiconductor in which the present invention is implemented.

FIG. 1C represents a third example of an architecture of a gate driver of a power semiconductor in which the present invention is implemented.

According to the third example of realization, a conditioner 10c generates an expected gate signal VGexp from the input signal In provided to the gate driver 12c that provides a gate signal VGmeas to the power semiconductor S1. The gate signal VGmeas is compared to the expected gate driver signal VGexp by a difference detection module 13c in order to determine deviations of VGmeas and VGexp. The comparison may be a subtraction of one signal to the other signal and an amplification of the subtraction result. The output of the difference detection module 13c is provided to a diagnostic module 14c that quantifies the output of the difference detection module 13c using, for example, comparison with different kinds of signal envelopes, mathematical operations, e.g. max, mean and integral.

The generation by the conditioner 10c of the expected gate signal VGexp may be as the one disclosed in FIG. 1A or 1B with a particular processing that takes into account the feedback signal.

The input signal In is for example a PWM signal generated by an external controller not shown in FIG. 1C.

In the third example of realization, the gate driver 12c uses the input signal In together with a feedback signal from the power semiconductor. One example of feedback signal is the collector voltage of the power semiconductor that can be used for protection and/or active gate signal trajectory control. The feedback signal is typically combined with the PWM signal by the gate driver 12c and the conditioner 10c.

The generation by the conditioner 10c of the expected gate signal VGexp may be as the one disclosed in FIG. 1A or 1B with a particular processing that takes into account the feedback signal.

The expected signal VGexp is a signal that corresponds to the signal outputted by the gate driver when no deterioration of the gate driver and/or of the power semiconductor and/or of a load linked to the power semiconductor exist.

Figure 1D:
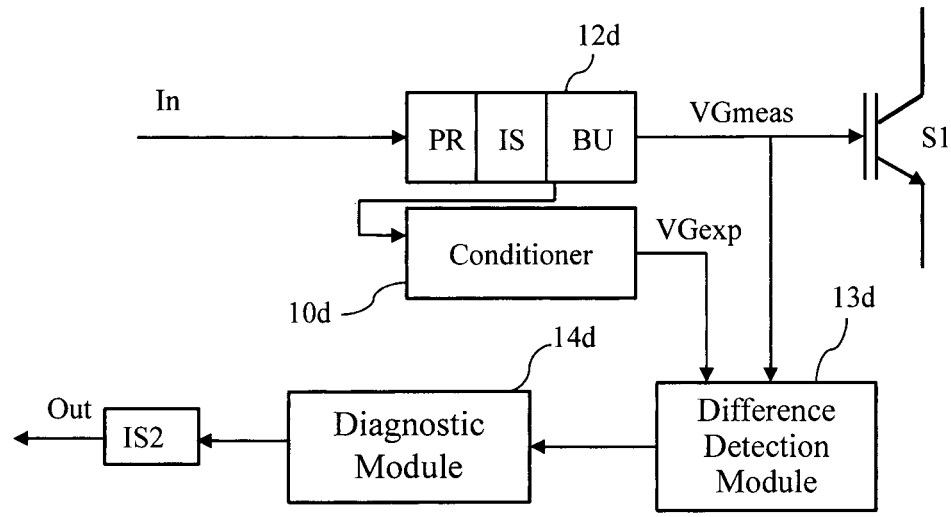
FIG. 1D represents a fourth example of an architecture of a gate driver of a power semiconductor in which the present invention is implemented.

FIG. 1D represents a fourth example of an architecture of a gate driver of a power semiconductor in which the present invention is implemented.

According to the fourth example of realization, a conditioner 10d generates an expected gate signal VGexp from the input signal In provided to the gate driver 12d that provides a gate signal VGmeas to the power semiconductor S1. The gate signal VGmeas is compared to the expected gate driver signal VGexp by a difference detection module 13d in order to determine deviations of VGmeas and VGexp. The comparison may be a subtraction of one signal to the other signal and an amplification of the subtraction result. The output of the difference detection module 13d is provided to a diagnostic module 14d that quantifies the output of the difference detection module 13d using, for example, comparison with different kinds of signal envelopes, mathematical operations, e.g. max, mean and integral.

The input signal In is for example a PWM signal generated by an external controller not shown in FIG. 1D.

In the example of FIG. 1D, the driver 12c is composed of a preprocessing module PR, an insulation module IS and a buffer BU. The output of the insulation module IS is provided to the conditioner 10d as an input signal.

A second insulation module IS2 is provided at the output of the diagnostic module 14d. The expected signal VGexp is a signal that corresponds to the signal outputted by the gate driver when no deterioration of the gate driver and/or of the power semiconductor and/or of a load linked to the power semiconductor exist.

Figure 2:
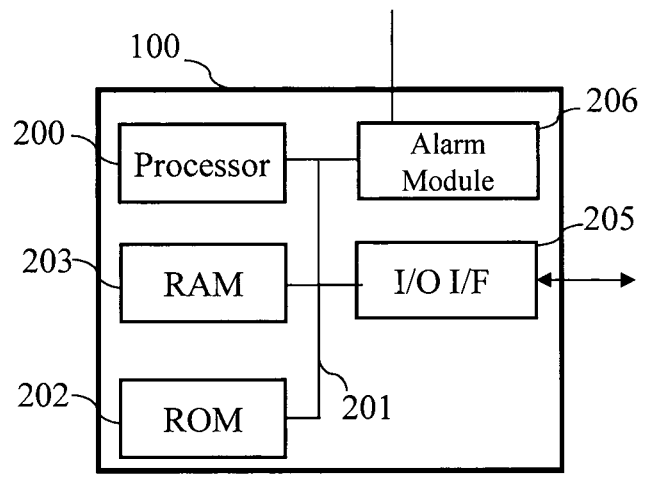
FIG. 2 is a diagram representing the architecture of a diagnostic module in which the present invention is implemented.

FIG. 2 is a diagram representing the architecture of the diagnostic module in which the present invention is implemented. The diagnostic module 100, that can be either 14a, 14b, 14c or 14d has, for example, an architecture based on components connected together by a bus 201 and a processor 200 controlled by the program as disclosed in FIG. 3.

The bus 201 links the processor 200 to a read only memory ROM 202, a random access memory RAM 203, an input output interface 205 and eventually an alarm module 206.

Figure 3:
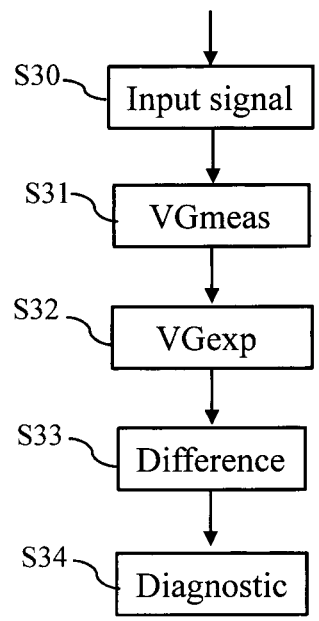
FIG. 3 represents an algorithm executed according to the present invention.

The memory 203 contains registers intended to receive variables and the instructions of the programs related to the algorithm as disclosed in FIG. 3.

The read only memory 202 contains instructions of the programs related to the algorithm as disclosed in FIGS. 3, which are transferred, when the diagnostic module 100 is powered on, to the random access memory 203.

Any and all steps of the algorithm described hereafter with regard to FIG. 3 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the diagnostic module 100 includes circuitry, or a device including circuitry, causing the diagnostic module 100 to perform the steps of the algorithms described hereafter with regard to FIG. 3. The memory 202 comprises envelope signals as disclosed in FIG. 5.

FIG. 3 represents an algorithm executed according to the present invention. At step S30, the input signal is received as disclosed in reference to FIGS. 1A to 1D. At step S31, the gate driver provides a gate signal VGmeas to the power semiconductor S1.

At step S32, the conditioner 10 provides the expected signal VGexp. At step S33, the difference detection module 13 provides to the diagnostic module 100 a signal representative of the comparison of the gate signal VGmeas to the expected signal VGexp. At step S34, the diagnostic module 100 analyses the signal received from the difference detection module 13.

Figure 4:
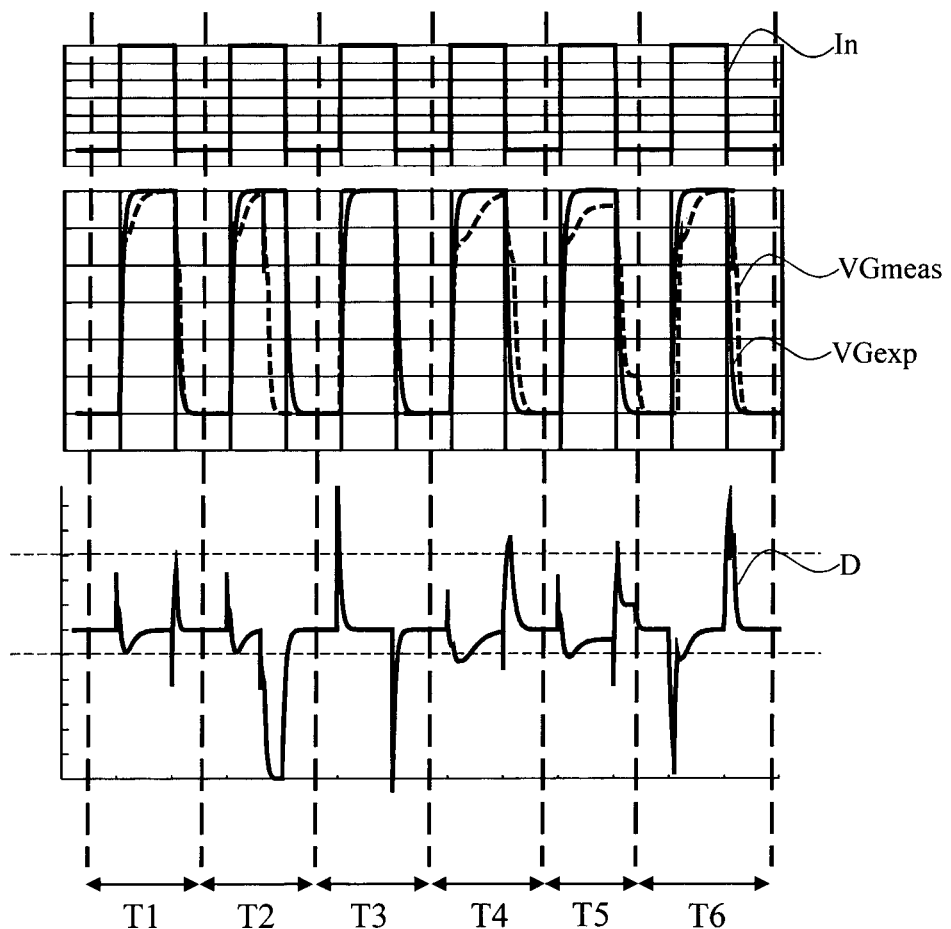
FIG. 4 represents examples of signals that can occur during the operation of a gate diver of a power semiconductor.

Examples of signals received from the difference detection module 13 are given in FIG. 4. FIG. 4 represents examples of signals that can occur during the operation of a gate diver of a power semiconductor. In FIG. 4 the signals In, VGmeas, VGexp, the signal D, which is the signal at the output of the difference detection module 13, are shown during different intervals noted T1 to T6.

In the time interval T1, the signals VGmeas and VGexp are almost identical. The shape of signals VGmeas and VGexp are representative of a normal operation of the gate driver 12 and the power semiconductor S1.

In the time interval T2, the output of the gate driver 12 provides a wrong logic level, the signal difference D saturates indicating a fault.

In the time interval T3, the input characteristic of power semiconductor S1 presents a lower resistance (e.g. the gate resistance is short-circuited), the signal difference D indicates the anomaly as a short and high value pulses during the transitions. Furthermore, during the transition the difference signal D has opposite sign compared to the normal operation.

In the time interval T4, the input characteristic of power semiconductor S1 presents a higher resistance (twice bigger than normal, the difference signal D indicates the anomaly as large and high value pulses.

In the time interval T5, the power supply level of the gate driver 12 has a droop, the difference signal D indicates a constant error that doesn't return to 0.

In the time interval T6, the gate driver 12 has an abnormal delay time, the difference signal D indicates high values spikes during the transitions.

The diagnostic module 100 may compare the difference signal D to a threshold in order to detect a deterioration, like for example the example given in the time intervals T2, T3 and T6. The value of the threshold is either pre-defined, or initially auto-defined like for example 120% the maximum value observed during the first 100 cycles of operation, or constantly auto-defined like for example 120% the maximum value observed until now. The diagnostic module 100 may integrate the difference signal D in order to detect a deterioration as the one disclosed in the time interval T5. The diagnostic module 100 may check if the signal D is within predetermined envelopes stored in memory in order to detect a deterioration.

Figure 5:
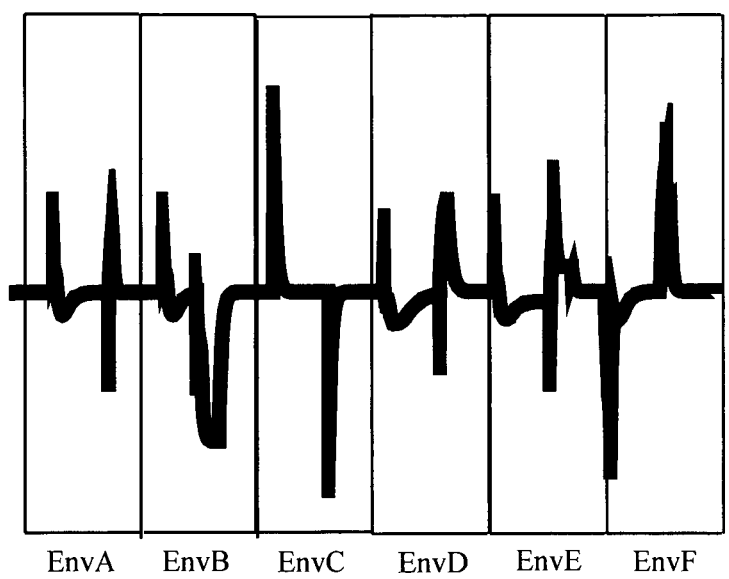
FIG. 5 represents examples of envelopes that are used by the diagnostic module for determining if a fault appears during the operation of the driver and of the power semiconductor.

Examples of such envelopes are given in FIG. 5. FIG. 5 represents examples of envelopes that are used by the diagnostic module for determining if a fault appears during the operation of the driver and of the power semiconductor.

The envelope EnvA corresponds to a signal as shown in the time interval T1 of FIG. 4. The envelope EnvB corresponds to a signal as shown in the time interval T2 of FIG.

4. The envelope EnvC corresponds to a signal as shown in the time interval T3 of FIG. 4.

The envelope EnvD corresponds to a signal as shown in the time interval T4 of FIG. 4. The envelope EnvE corresponds to a signal as shown in the time interval T5 of FIG. 4. The envelope EnvF corresponds to a signal as shown in the time interval T6 of FIG. 4.

Figure 6:
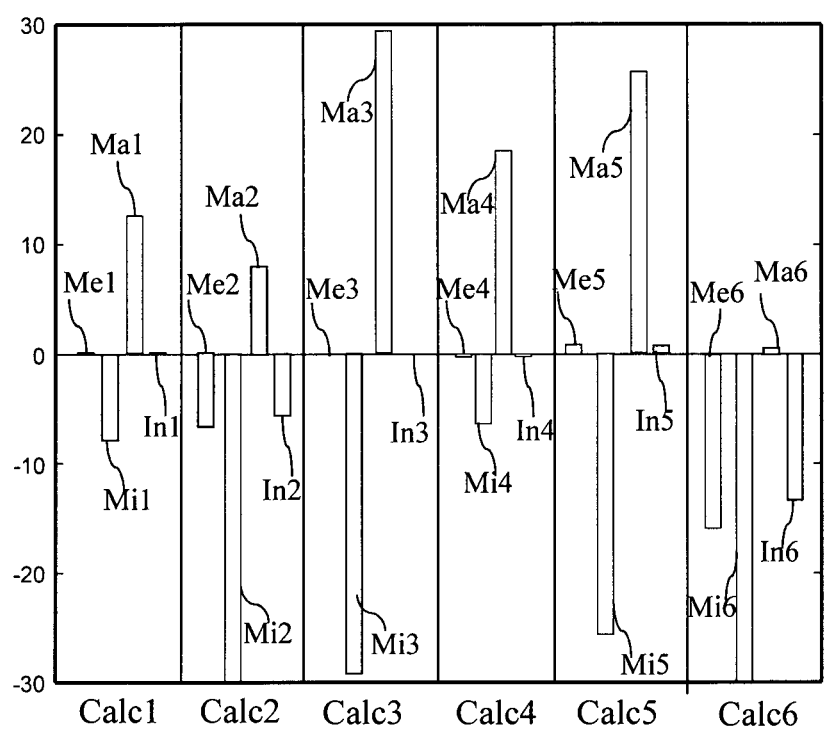
FIG. 6 represents mean, min, max and integral values corresponding to the differences observed when no deterioration occurs and when various different deteriorations occur.

FIG. 6 represents mean, min, max and integral values corresponding to the differences observed when no deterioration occurs and when various different deteriorations occur.

The calculations in the part noted calc1 correspond to calculations performed on the signal as shown in the time interval T1 of FIG. 4. The calculation result noted Me1 corresponds to the mean of the signal as shown in the time interval T1, the calculation result noted Mi1 corresponds to the minimum of the signal as shown in the time interval T1, the calculation result noted Ma1 corresponds to the maximum of the signal as shown in the time interval T1 and the calculation result noted In1 corresponds to the integral of the signal as shown in the time interval T1.

The calculations in the part noted calc2 correspond to calculations performed on the signal as shown in the time interval T2 of FIG. 4. The calculation result noted Me2 corresponds to the mean of the signal as shown in the time interval T2, the calculation result noted Mi2 corresponds to the minimum of the signal as shown in the time interval T2, the calculation result noted Ma2 corresponds to the maximum of the signal as shown in the time interval T2 and the calculation result noted In2 corresponds to the integral of the signal as shown in the time interval T2.

The calculations in the part noted calc3 correspond to calculations performed on the signal as shown in the time interval T3 of FIG. 4. The calculation result noted Me3 corresponds to the mean of the signal as shown in the time interval T3, the calculation result noted Mi3 corresponds to the minimum of the signal as shown in the time interval T3, the calculation result noted Ma3 corresponds to the maximum of the signal as shown in the time interval T3 and the calculation result noted In3 corresponds to the integral of the signal as shown in the time interval T3.

The calculations in the part noted calc4 correspond to calculations performed on the signal as shown in the time interval T4 of FIG. 4. The calculation result noted Me4 corresponds to the mean of the signal as shown in the time interval T4, the calculation result noted Mi4 corresponds to the minimum of the signal as shown in the time interval T4, the calculation result noted Ma4 corresponds to the maximum of the signal as shown in the time interval T4 and the calculation result noted In4 corresponds to the integral of the signal as shown in the time interval T4.

The calculations in the part noted calc5 correspond to calculations performed on the signal as shown in the time interval T5 of FIG. 4. The calculation result noted Me5 corresponds to the mean of the signal as shown in the time interval T5, the calculation result noted Mi5 corresponds to the minimum of the signal as shown in the time interval T5, the calculation result noted Ma5 corresponds to the maximum of the signal as shown in the time interval T5 and the calculation result noted In5 corresponds to the integral of the signal as shown in the time interval T5.

The calculations in the part noted calc6 correspond to calculations performed on the signal as shown in the time interval T6 of FIG. 4. The calculation result noted Me6 corresponds to the mean of the signal as shown in the time interval T6, the calculation result noted Mi6 corresponds to the minimum of the signal as shown in the time interval T6, the calculation result noted Ma6 corresponds to the maximum of the signal as shown in the time interval T6 and the calculation result noted In6 corresponds to the integral of the signal as shown in the time interval T6.

For example, if the mean is superior to null value, the value is considered as corresponding to no deterioration, otherwise the value is considered as corresponding to a deterioration. If the minimum is superior to minus ten value, the value is considered as corresponding to no deterioration, otherwise the value is considered as corresponding to a deterioration. If the maximum is superior to ten value, the value is considered as corresponding to no deterioration, otherwise the value is considered as corresponding to a deterioration. If the integral value is superior to minus five, the value is considered as corresponding to no deterioration, otherwise the value is considered as corresponding to a deterioration.

These calculations can be implemented with simple fast analog circuits. The comparison of these metrics to threshold values as the abovementioned one gives unique pattern that allows identifying a deterioration. The diagnostic module detects a deterioration if one of the comparisons shows a degradation. The diagnostic module may provide comparison results as an output signal.

As a result, if a deterioration occurs, the alarm block 206 is activated or a signal Out is outputted in order to inform that a deterioration occurs, and which deterioration occurs.

If such deterioration occurs, the difference signal D and/or the comparison results is or are memorized by the diagnostic module in order to provide data that may be useful for maintenance staff.

In a variant of operation, the diagnostic module performs an initial validation of the communication with the gate driver. In this mode, the gate driver is deactivated such that VGmeas=0. Thus, D=VGexp, the signal D is an image of the input signal. Thus, in case of a misconnection of the input or output signal, or in case of a default in the conditioner, an anomaly is easily detected.

The invention claimed is:

1. A device for monitoring a gate signal of a power semiconductor, the gate signal of the power semiconductor being provided by a gate driver, the device comprising:
   generating circuitry to generate an expected reference signal that corresponds to the signal outputted by the gate driver when no deterioration of the gate driver and/or of the power semiconductor and/or of a load linked to the power semiconductor exists;
   comparing circuitry to compare the expected reference signal and the signal outputted by the gate driver;
   determining circuitry to determine if a deterioration of the gate driver and/or of the power semiconductor and/or of a load linked to the power semiconductor exists using the result of the comparing of the expected reference signal and the signal outputted by the gate driver.

2. The device according to claim 1, wherein the generating circuitry are composed of a capacitor and a resistor.

3. The device according to claim 2, wherein the gate driver and the generating circuitry are each configured to receive a pulse width modulated signal and a signal taken on a connection of the power semiconductor that is different from the gate signal.

4. The device according to claim 2, wherein the determining circuitry processes the result of the comparison of the expected reference signal and the signal outputted by the gate driver by comparing the result of the comparison to a threshold.

5. The device according to claim 2, wherein the determining circuitry processes the result of the comparison of the expected reference signal and the signal outputted by the gate driver by comparing the result of the comparison to stored envelopes of signals.

6. The device according to claim 1, wherein the gate driver and the generating circuitry are each configured to receive a pulse width modulated signal and a signal taken on a connection of the power semiconductor that is different from the gate signal.

7. The device according to claim 6, wherein the determining circuitry processes the result of the comparison of the expected reference signal and the signal outputted by the gate driver by comparing the result of the comparison to a threshold.

8. The device according to claim 6, wherein the determining circuitry processes the result of the comparison of the expected reference signal and the signal outputted by the gate driver by comparing the result of the comparison to stored envelopes of signals.

9. The device according to claim 1, wherein the determining circuitry processes the result of the comparison of the expected reference signal and the signal outputted by the gate driver by comparing the result of the comparison to a threshold.

10. The device according to claim 9, wherein the value of the threshold is predetermined.

11. The device according to claim 9, wherein the value of the threshold is equal to X % of the respective maximum value observed during the first 100 cycles of operation of the device, X % being predefined and superior to 100%.

12. The device according to claim 9, wherein the value of the threshold is equal to X % of the maximum value observed from the beginning of operation of the device, X % being predefined and superior to 100%.

13. The device according to claim 1, wherein the determining circuitry processes the result of the comparison of the expected reference signal and the signal outputted by the gate driver by comparing the result of the comparison to stored envelopes of signals.

14. A method for monitoring a gate signal of a power semiconductor, the gate signal of the power semiconductor being provided by a gate driver, the method comprising:
- generating an expected reference signal that corresponds to the signal outputted by the gate driver when no deterioration of the gate driver and/or of the power semiconductor and/or of a load linked to the power semiconductor exists;
- comparing the expected reference signal and the signal outputted by the gate driver;
- determining if a deterioration of the gate driver and/or of the power semiconductor and/or of a load linked to the power semiconductor exists using the result of the comparing of the expected reference signal and the signal outputted by the gate driver.

* * * * *